United States Patent [19]
Warriner et al.

[11] Patent Number: 5,130,923
[45] Date of Patent: Jul. 14, 1992

[54] SELECTIVE DYNAMIC RAM ADDRESS GENERATOR WITH PROVISION FOR AUTOMATIC REFRESH

[75] Inventors: R. John Warriner, Amherst; Mark J. Lankarge, South Deerfield, both of Mass.

[73] Assignee: Valitek, Inc., Hadley, Mass.

[21] Appl. No.: 534,289

[22] Filed: Jun. 6, 1990

[51] Int. Cl.⁵ .............................................. G11C 8/04
[52] U.S. Cl. ................... 365/240; 365/189.12; 365/222; 365/236
[58] Field of Search ............... 365/189.12, 221, 222, 365/236, 237, 240

[56] References Cited
U.S. PATENT DOCUMENTS 4,006,468 2/1977 Webster ............................ 365/222
4,727,481 2/1988 Aquille et al. ...................... 365/236

Primary Examiner—Stuart N. Hecker
Assistant Examiner—Jack A. Lane
Attorney, Agent, or Firm—Iandiorio & Dingman

[57] ABSTRACT

An improved address generator for generating address values for refresh, read and write functions in a dynamic random access memory (RAM). Whether a refresh, write column, write row, read column or read row RAM addressing operation is to be performed is first determined. A shift register for storing and shifting at least one of the address values for each of the RAM addressing operations has its output connected to the address port of the RAM. A bit is selectively added, in response to the determination of which RAM addressing operation is to be performed, to the output of the shift register and the added value is submitted to the input of the shift register. A controller causes a data shift in the shift register at least once each time a bit is added to the value of the output of the shift register.

1 Claim, 2 Drawing Sheets

SELECTIVE DYNAMIC RAM ADDRESS GENERATOR WITH PROVISION FOR AUTOMATIC REFRESH

FIELD OF INVENTION

This invention relates to an improved address generator for generating read, write and refresh address values for a dynamic random access memory.

BACKGROUND OF INVENTION

In order to effectively use a dynamic random access memory (RAM) chip a method of addressing the memory locations is required. The RAM contains a set of inputs that comprise the address values. The row and column binary words are combined to form the address which corresponds to a location in memory in which a byte of information may be stored. When an address is input the corresponding location will be susceptible to reading, writing or refreshing. Refresh is a procedure essential to the proper functioning of a dynamic RAM, in which each row address is accessed every few milliseconds to recharge the capacitors that comprise the electrical memory storage units for individual bits in the corresponding row of memory.

The traditional method for carrying out an addressing operation using a finite state machine is to utilize separate counters connected to separate tri-state buffers for each of the functions of read row, read column, write row, write column and refresh. All buffers are separately enabled by a controller and connected to a common address bus to the RAM.

Three significant problems arise from this traditional addressing method. First, the system responds relatively slowly requiring switching between five different buffer systems. Secondly, the system contains a significantly high circuit chip count, adding to size, weight and most importantly, cost of constructing a device containing memory. Finally, the availability of discrete counters and other hardware in larger bit sizes necessary to address a 512 K byte and larger RAM is significantly limited. Without such large capacity hardware, the overall chip count multiplies enormously owing to the need to double the number of chips at each sage of the circuit to accommodate the additional bit capacity.

SUMMARY OF INVENTION

It is therefore an object of this invention to provide a system for addressing a dynamic random access memory (RAM) to perform read row, read column, write row, write column, and refresh operations.

It is a further object of this invention to provide a system for addressing RAM with significantly enhanced speed.

It is a further object of this invention to provide a system for addressing RAM with a lower overall circuit chip count using readily available circuit hardware.

It is a further object of this invention to provide a system for addressing RAM of large memory capacity with address sizes of up to and exceeding 9 bits.

This invention results from the realization that a truly effective RAM addressing system can be achieved through a configuration of series connected shift registers having an output signal path to the RAM address port, with each register containing an address value designated as representative of either a read, write or refresh operation, and each address value is either selectively or continuously incremented as it is out putted to the address port.

This invention features an improved address generator for generating address values for refresh, read and write functions in a dynamic random access memory (RAM). There are means for determining whether one of a refresh, column write, row write, column read or row read RAM addressing is to be performed.

There are shift register means for storing and shifting at least one of the address values for each of the RAM addressing operations with the output of the shift register means being connected to the address port of the RAM.

There are also means, responsive to the means for determining, for selectively adding a bit to the value of the output of the shift register means and for submitting the added value to the input of the shift register means. There are, further, means for controlling the shift register means to cause a data shift at least once each time the means for adding adds a bit to the value of the output of the shift register means.

In a preferred embodiment, the shift register means further includes a means for shifting at least nine bits. The means for controlling further includes clocking means for clocking the shift registers, as well as means for selecting one of either the row address, column address or write enable function on the RAM. The means for controlling may also include means for selectively carrying a bit value to be added by the means for selectively adding. Finally, the shift register means may include a plurality of series shift registers, one corresponding to each of the RAM addressing operations to be performed.

BRIEF DESCRIPTION OF THE DRAWINGS

Other objects, features and advantages will occur from the following description of a preferred embodiment and the accompanying drawings, in which.

DISCLOSURE OF PREFERRED EMBODIMENT

Figure 1:
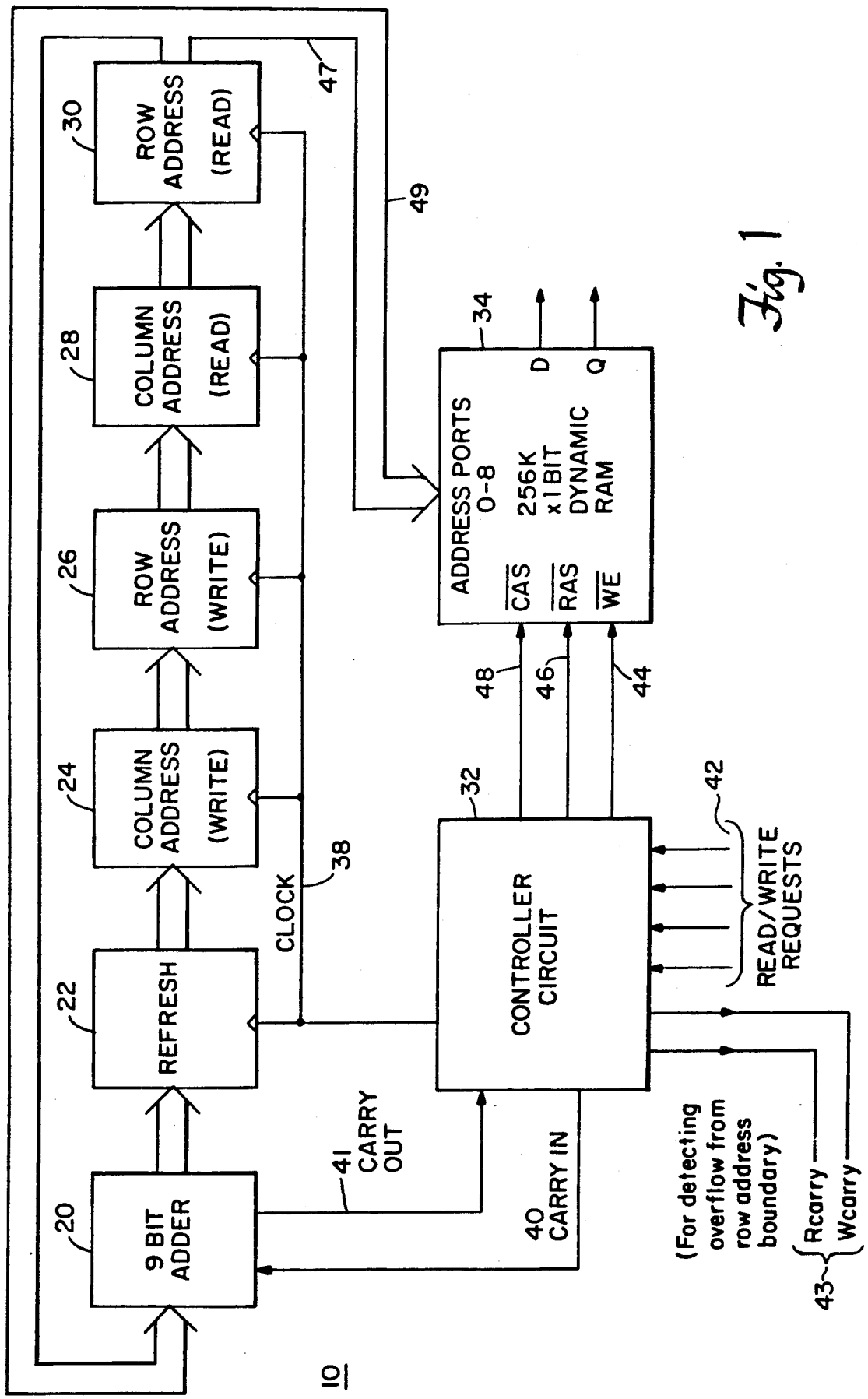
FIG. 1 is a block diagram of an improved address generator according to this invention.

A dynamic random access memory addressing system, 12, is depicted in the block diagram 10 of FIG. 1. This embodiment illustrates a configuration utilizing nine-bit addresses for memory rows and for memory columns, which allows access to 256K RAM 34, a memory size commonly used in the art. A finite state machine based controller circuit 32 that receives read and write requests 42 is responsible for the functioning of the system. It generates the clocking signal 38 that allows shift registers 22 to 30 to perform a shifting function. It further generates the row address strobe 46, or the column address strobe 48 and, to instruct RAM 34 whether it is the upper lower 1/2 of the address word, respectively, present on the address bus 49. Additionally, controller unit 32 generates a enable 44 signal, in response to external system requests 42, that instruct the RAM 34 whether a read or write operation is taking place.

The ability to address large numbers of address values derives from the use of shift registers each with output connected in series. There are five shift registers in this example, each acting as a storage cell and each consisting of nine parallel latches to store a 9 bit address value. Each register in FIG. 1 is shown with a functional designation, namely, refresh 22, column write 24, row write 26, column read 28, nd row read 30. These designations identify the address word, and the associated read/write/refresh function, present in the register and shift right to the next of register 22 to 30 each time a clock signal 38 is provided. The last register 30 outputs a value, on clock signal 38, to the adder 20 which then sends a value back to the first register 22. Adder 20 increments the value received by it if carry-in signal 40 is received from controller 32. Each time system 12 instruct the performance of a given address operation the address value is automatically incremented. If such a read/write operation is required, at a particular address, a value is added each time the address value denoting the designated operation is shifted to be output 47 by the last register, which also connects, via address bus 49, to the RAM address port. For example, if the controller desired to access a group of successive addresses in read mode it would provide a row address strobe signal 46 to the RAM 34 and simultaneously send a carry-in signal 40 to the adder and continue doing this every five clock signals since the row read address would be contained in the last, outputting register 30 at this time, every time.

In practice, a refresh must be performed repeatedly. Thus, a bit is always added to the refresh address value by the controller, and a row read is always asserted when a refresh address is contained at the outputting register 30.

A column or row address is cycled completely by counting from 0 through 511, and then to 0. Since the read and write addresses are comprised of one column and one row address the row may be considered the least significant component in the binary address, and the column considered to be the most significant. In such an implementation the row would be increased by adding one for each respective row access whereas the column would be increased by adding one for every $2^n$ row accesses, where n represents the number of bits in width of the address shift registers.

The advantage of using a shift register format comprising parallel latches is that each function of write, read and refresh in rows or columns may be contained in one fast clocking shift register, and any increase in the number of address locations requiring address values of longer word may be accommodated simply by adding the required number of parallel latches to the shift registers and the adder.

An overflow signal 41 from the adder 20 is sent to the RAM controller 32 to allow the controller to determine if an address has cycled to zero.

Figure 2:
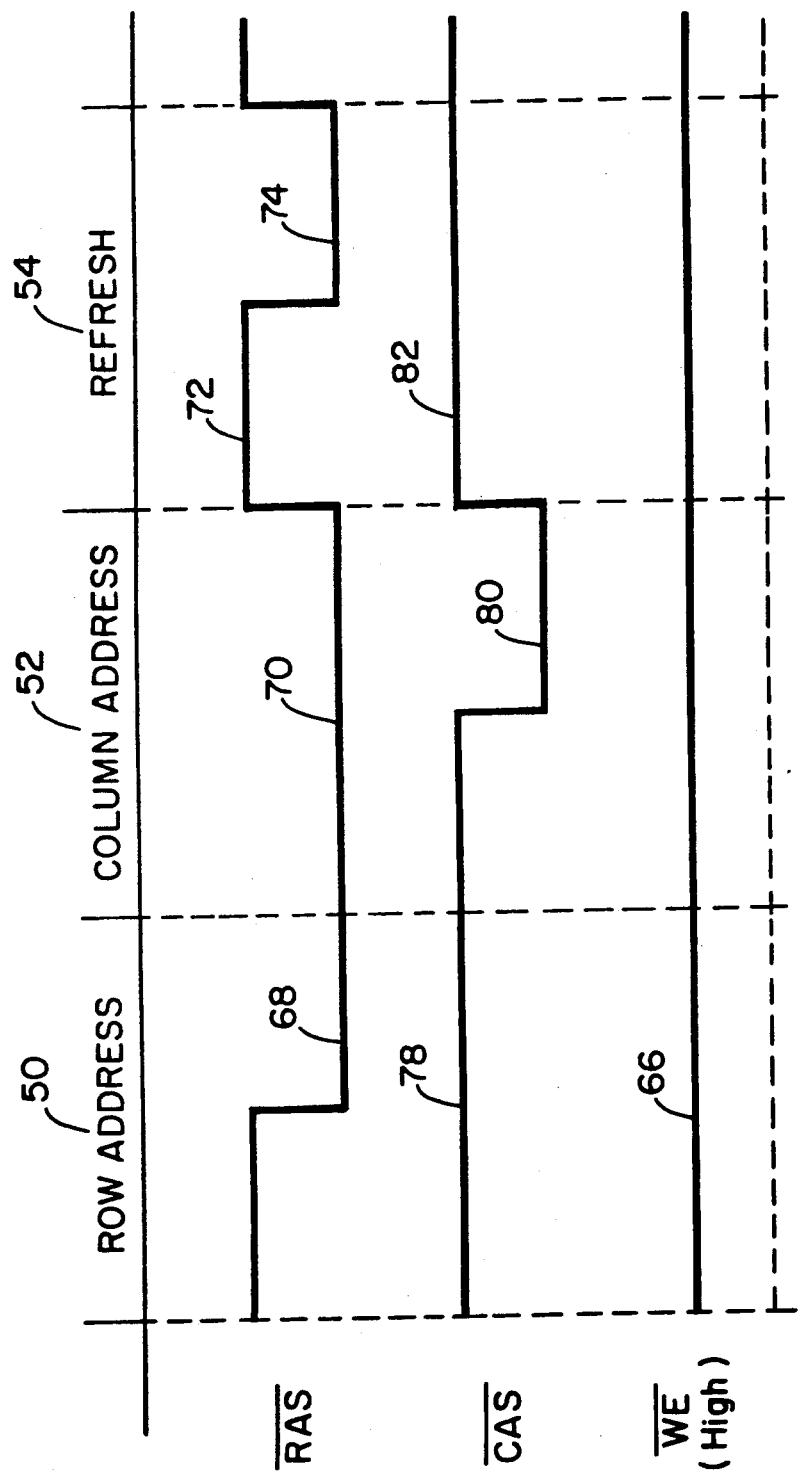
FIG. 2 is an example of a timing diagram of the operation of the address generator of FIG. 1.

An address control timing diagram is depicted in FIG. 2. This diagram shows the timing intervals in which the operations of row address 50, column address 52 and refresh 54 occur. When the row address select signal provided is low 68 while the column address signal is high 78, a given row is selected corresponding to the address value present at the RAM address port. The desired column is then selected by providing column address select signal low 80 while the row address select is also low 70. At this point, the value present at the address port will correspond to the column selected. A memory location corresponding to the given row and column address may then be read. Both signals are then changed to high 72 and 82, and then row address select is again provided low 74 to allow a row refresh, corresponding to the address value of the row then present at the RAM address port. Through this entire time period, FIG. 2, the write enable signal 66 is shown high, thus only allowing a read of data. If write enable had been provided low, the RAM would have been susceptible to a storing of new data at the designated row and column address.

Since the operations of row address select, column address select and write enable are functions of the controller circuit 32 of FIG. 1, the clock signals allowing the shift registers to transfer a new output value to the RAM address port will have to function in conjunction with these select and enable signals. Select signals, conversely, will be asserted only upon the clock signal that corresponds to the output to the RAM address port of a given function's address value by the shift registers.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. An address generator for generating and incrementing digital words of length n, to be used as address values for refresh, read, and write functions in addressing a dynamic random access memory (RAM) having memory location address words of bit length 2n, comprising:

control means;

at least five storage cells for storing digital words of bit length n, each of said cells comprising at least n parallel single-bit latches; each of said latches comprising: an input; an output; and means, responsive to said control means, for outputting a stored digital bit an storing an inputted digital bit; wherein said cells are serially interconnected such that each of said cells except for a first storage cell, has an input connected to the output of another of said cells, and each of said cells, except for a last storage cell, has an output connected to the input of another of said cells;

addition means, interposed between the output of said last storage cell and the input of said first storage cell, comprising: an input; an output; means, responsive to the reception of a digital word, for sending the digital word; and means, responsive to said control means, for incrementing the digital word before sending; said control means further comprising means to automatically increment a digital word, designated as a refresh address value and received by said addition means;

means, disposed between the RAM and said last storage cell, for providing an outputted digital word to the RAM;

said control means further comprising means for providing a row read signal to the RAM whenever a digital word, designated as a refresh word, is outputted to the RAM for refreshing the row of memory addressed by the refresh word; and means for generating an overflow signal, for indicating to said control means that a digital word comprising all zeroes has been sent by said addition means.

* * * * *